United States Patent [19]
Clark

[11] Patent Number: 5,272,730

[45] Date of Patent: Dec. 21, 1993

[54] DIGITAL PHASE-LOCKED LOOP FILTER

[75] Inventor: Lawrence T. Clark, Tempe, Ariz.

[73] Assignee: VLSI Technology, Inc., San Jose, Calif.

[21] Appl. No.: 811,513

[22] Filed: Dec. 20, 1991

[51] Int. Cl.$^5$ .............................................. H03D 3/24
[52] U.S. Cl. .................... 375/120; 360/51; 375/81
[58] Field of Search .............. 375/81, 82, 119, 120; 329/307, 325; 364/724.01; 360/51, 37.1; 455/183.1, 260; 328/155, 134; 307/511

[56] References Cited

U.S. PATENT DOCUMENTS

| | | | |
|---|---|---|---|
| 4,030,045 | 6/1977 | Clark | 375/120 |
| 4,231,071 | 10/1980 | Anderson | 360/51 |
| 5,097,489 | 3/1992 | Tucci | 375/120 |

OTHER PUBLICATIONS

Western Digital Corp. Storage Management Products Handbook, 1984, pp. 121–123.
Standard Microsystems Corp. 1988 Components Catalog, pp. 514, 519, and 555.
Intel 820 77 A A, pp. 4–86 and 4–87.
National Semiconductor DP8473 Floppy Disk Controller Data Sheet, pp. 5–6 to 5–9.

*Primary Examiner*—Curtis Kuntz
*Assistant Examiner*—T. Ghebretinsae
*Attorney, Agent, or Firm*—LaValle D. Ptak

[57] ABSTRACT

A digital filter for a phase-locked loop operates to compare the bit values of the data represented by the incoming pulse stream with patterns in that pulse stream known to produce bit shifting (either early or late). The bit shift caused by physical interaction of bits encoded on computer diskettes or the like always is predictable, in accordance with the pattern of previous bits, the current bit and the next bit. This information is processed by a logic circuit to predict which pulses in the incoming stream of data pulses are shifted. A signal is produced each time a predicted shifted pulse is determined; and this signal is utilized in conjunction with the output of the phase difference counter in the digital phase-locked loop to permit the phase of the controlled oscillator to be adjusted at each unshifted bit in a normal manner, and compensated for adjustment in a modified manner as a result of the prediction of the shifted pulses.

9 Claims, 2 Drawing Sheets

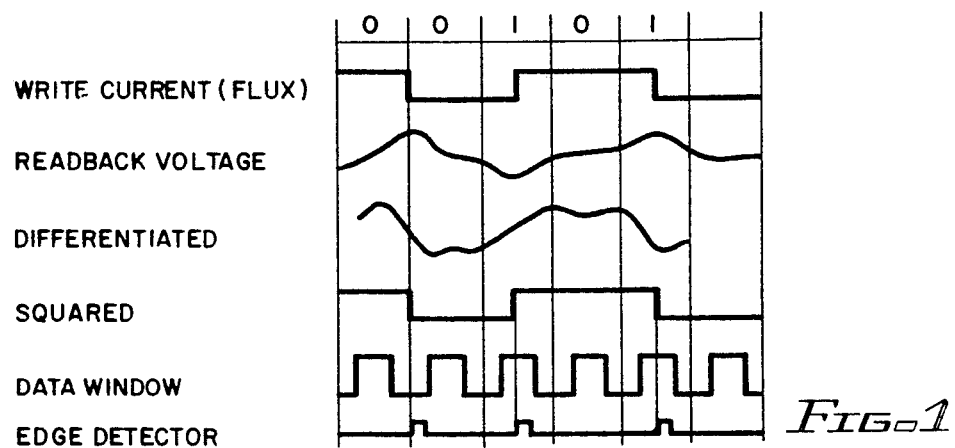
Fig. 1
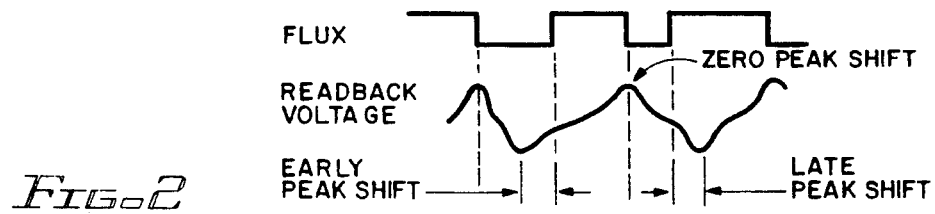
Fig. 2
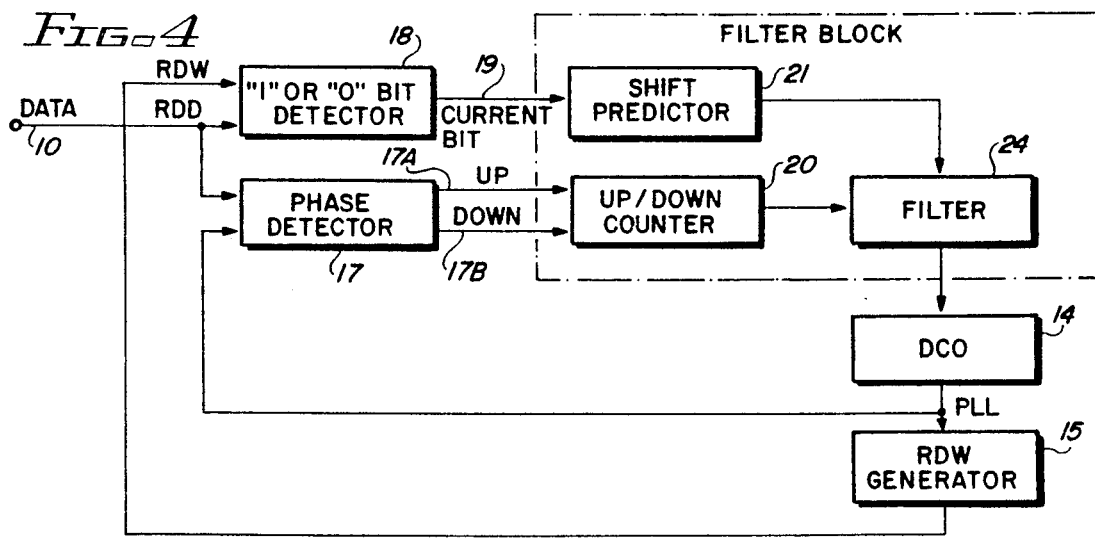
Fig. 3
Fig. 4

5,272,730

DIGITAL PHASE-LOCKED LOOP FILTER

BACKGROUND

Phase-locked loop systems are used in a variety of applications for synchronizing the phase of a local oscillator with the frequency of incoming signals, either analog or digital. Digitally controlled oscillators (DCO) are increasingly being used in phase-locked loop (PLL) systems for many applications. All digital phase-locked loops, however, generally do not provide the level of performance obtained from analog PLL systems. This is particularly true of digital phase-locked loop systems which are used to synchronize a digitally controlled oscillator (DCO) with the synchronization field frequency and the incoming data obtained from floppy disks used in personal computers and the like. The problem primarily is due to the granularity of digital systems (introducing quantization noise). Here, the penalty is offset by the use of "intelligent" filtering.

A problem, which is inherent in the data encoded in a floppy disk, is that at high density the data on a floppy disk (or on a computer hard disk) may suffer from bit shifting, that is, a tendency of bit pulses, which are close to one another, to appear to push apart, due to the algebraic addition or superposition of the waveforms. This occurs because these pulses are encoded as magnetic flux transitions on the disk, which tend to interfere with one another. If pulses properly appear in each bit position, there is no bit shift. This, however, is an ideal situation. Frequently pulses are missing or are shifted, which causes the synchronization of the oscillator in a digitally controlled phase-locked loop to be subject to loop "jitter" or hunting. The reason is that relatively large phase adjustments may be made by the PLL whenever errors due to bit shift occur; and these adjustments then need to be corrected when properly located data pulses occur.

A typical approach to deal with the problem noted above, for both analog and digital PLL's, is to make the filter in the PLL loop very low-pass or low-gain, that is, to make the gain and bandwidth of the filter such that the PLL cannot track the change in bit position if it is large. This approach, however, causes the initial locking to the incoming signal during synchronization to be slow. Consequently, the filter often is a compromise between the requirement for positive and quick locking and the desirability to prevent the filter from tracking changes in large bit position shifts.

Another approach is to employ a multi-section or multifunction filter, which is operated in a high-gain mode for synchronization and a low-gain mode for tracking. This, however, introduces increased complexity to systems in which it is used.

It is desirable to provide a filter for a digital PLL which always is operated in a high-gain mode of operation, and which, at the same time, is not subject to erroneous output as a result of bit shifting.

SUMMARY OF THE INVENTION

Accordingly, it is an object of this invention to provide an improved filter for a phase-locked loop system.

It is another object of this invention to provide an improved filter for a digital phase-locked loop system.

It is an additional object of this invention to provide an improved filter for a phase-locked loop system, which is operated in a high-gain mode at all times.

It is a further object of this invention to provide a filter for a digital phase-locked loop system, which is particularly suitable for MFM disk/tape data and which is not subject to erroneous operation as a result of bit shifting in the incoming data signal to which the phase-locked loop is synchronized.

In accordance with a preferred embodiment of the invention, a digital PLL filter operates to analyze the incoming pattern of bits in the data signal, to which a DCO or VCO is to be synchronized, to predict the occurrence and direction of possible shifted bits. This information then is utilized in conjunction with the output of the PLL phase detector to modify the information supplied from the phase detector to the oscillator control to adjust the oscillator period to bring the reference back into lock, based on the adjusted information. This operation significantly reduces "jitter" or "oscillation" of the PLL.

BRIEF DESCRIPTION OF THE DRAWINGS

FIG. 1 is a diagrammatic representation of ideal read/write waveforms for understanding the operation of PLL systems;

FIG. 2 is a diagrammatic representation of bit shifting distortion;

FIG. 3 is a table useful in explaining the implementation and operation of a preferred embodiment of the invention;

FIG. 4 is a block diagram of a preferred embodiment of the invention; and

DETAILED DESCRIPTION

Figure 5:
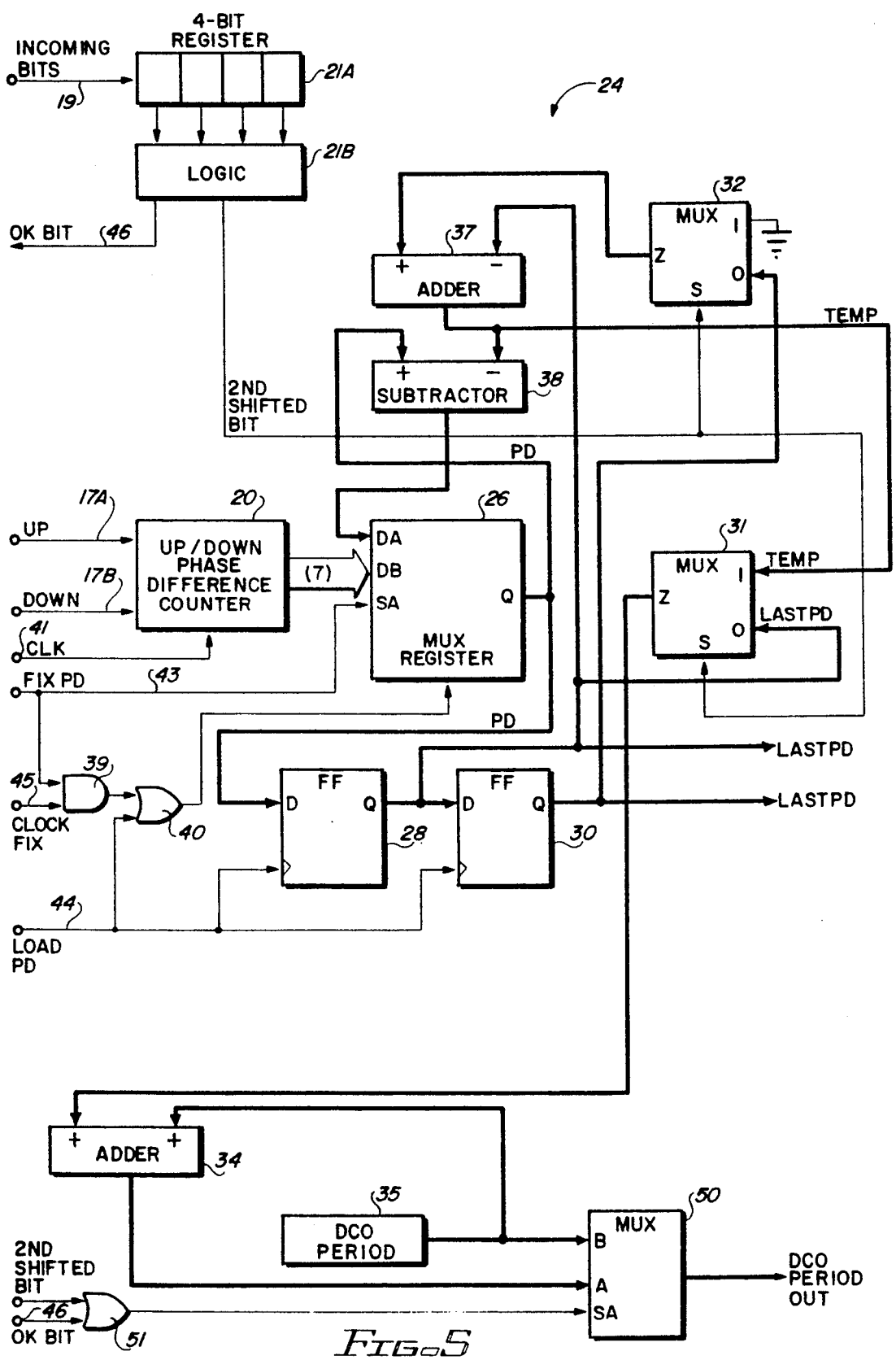
FIG. 5 is detailed block diagram of the portion of FIG. 4 which is enclosed in dot-dash lines.

Reference now should be made to the drawings, in which the same reference numbers are used in the different figures to designate the same or similar components.

FIG. 1 shows the ideal conditions for data encoded on a floppy disk or the like. The top line is a waveform indicative of the write current or magnetic flux, which is encoded on the disk to indicate the different bits of information. Directly above this waveform is a representation of the binary nature "0" or "1" of the information indicated in the line identified as "write current".

The next line is the actual "readback voltage", which results from the information encoded in the top line. The third line "differentiated" comprises the differentiated readback voltage of the line immediately above. When this information is read from the disk and passed through a squaring circuit, it should result in a squared electrical pulse waveform "squared", which ideally is an identical mirror or representation of the write current, which was used to magnetically encode the information on the disk in the first place. The next line beneath "squared" is a typical "data window" pulse series, which is used for comparing the data of the pulses of the line "squared" with the frequency of a DCO or VCO in a phase-locked loop system. The bottom line is an "edge detector" series of pulses, which typically are output from a disk to the PLL during a "read". It is to be noted that the pulses from the edge detector are produced each time there is a rising edge or a falling edge in the "squared" electrical pulse data which is read from a disk encoded as shown in FIG. 1.

FIG. 2 illustrates the nature of the flux and readback voltage, which often actually occurs on a floppy disk. Particularly in disks which are encoded at high density, the data sometimes suffers from bit shifting; so that the flux, which is shown encoded in the line "write current" of FIG. 1, actually physically appears as the line "flux" of FIG. 2. This is a result of the tendency of bit pulses which are close to one another to actually interfere physically. As a consequence, the readback voltage of FIG. 2 has some of the peak shifts in the proper positions; but others are either "early" or "late", as illustrated in FIG. 2, and give the impression of closely spaced bits "pushing apart". When this waveform is differentiated and squared, the output data signal does not accurately track or represent the flux signal, which was used to encode the disk initially. As a result, pulses which are formed by detecting the edges of the squared and differentiated waveform, and which constitute the input to the data comparison or phase detector circuit of a PLL, are not properly positioned. This, in turn, causes erroneous operation of the PLL, typically in the form of unwanted "jitter" or "chasing" of the oscillator frequency, back and forth, as the early and late peak shifts of the readback data signals cause unnecessary and unwanted adjustments of the frequency of the oscillator in the PLL.

Analysis of patterns of bit shifts, which are caused by the physical interaction of the bits, that is, by flux changes on the disk media, have been found to be predictable. Patterns which produce predictable "late" and "early" bit shifts all are indicated in the table of FIG. 3. The reason the patterns of bit shifts can be predicted is that the shifts are a result of a physical magnetic phenomenon caused by the interaction of adjacent bits encoded on the disk media. It is only necessary to know the binary state of four successive bits to determine whether the third or penultimate bit of the moving pattern of four bits is likely to be shifted to a "late" or "early" peak of the type indicated in FIG. 2. In addition, only six patterns (due to the "don't care" X's) create a "late" or "early" shift. All other patterns result in a non-shifted or properly located bit (or no bit in MFM encoding). It should be noted in FIG. 3 that the first one of the "previous bits" in the top two rows is indicated as an "X". This is for the reason that it is irrelevant as to whether this bit is a binary "1" or a binary "0", so far as the predicted bit shift of the "next bit" is concerned.

In the encoding of information on a disk, precompensation is used on the disk write channel to pre-shift transitions in such a way that they appear unshifted, after the bit shifting occurs. This is done so that the bit shifting, which actually does take place, then moves the bits back to their originally intended locations. Precompensation, however, is not totally effective. The reason is that the physical parameters of the disk, such as deviation in coercivity and other factors, result in some bit shifting occurring even when precompensation is used.

Since bit shifting is predictable, it is possible to use a prediction of the shift, actually information on whether a bit is shifted or not, to modify the operation or phase adjustment of the output signal in a phase-locked loop. First, on unshifted bits, the equivalent of a zero-phase restart may be performed, that is, the adjustment in phase should be such that all of the phase error is eliminated. Stated differently, all of the detected phase error is used to adjust the phase of operation of the DCO or VCO in the PLL. This is not true, however, for shifted bits.

If a shifted bit occurs, the bit is known not to be in the center of the data window (shown in FIG. 1), at least theoretically. Consequently, some of the phase error which is detected must be maintained, that is, no adjustment of the phase or frequency of the oscillator should be made. In an analog implementation, this function is automatically performed by the use of the low-pass filter, which typically is used in such systems. Without some such function of the type provided by a low-pass filter, however, the PLL oscillates or jitters, chasing the shifted bits back and forth as they occur, with instability a likely result. Even a simple low-pass filter follows shifted bits to some extent, and consequently, performs non-optimally.

The circuit shown in FIG. 4 is designed to utilize the information, which is known from the patterns shown in the table of FIG. 3, to operate on the filter to prevent undesired chasing or jitter in the PLL from occurring.

To accomplish this, the sequence of data pulses, which is read back from the disk, differentiated and squared in accordance with the description made previously of the waveforms of FIG. 1, is applied to an input terminal 10, and to one of the two terminals of a phase detector 17. This data also is applied to a "1" or "0" bit detector 18, which determines the nature of the present bit in a read window or data window generated from the output of a digitally controlled oscillator (DCO) 14 by a data window or read window generator 15. The output of the generator 15 then is applied to the detector 18 to cause it to identify the status of each pulse or bit located within the window, as it appears on the data input 10.

It has been determined that by waiting one bit period or one pulse period to update the phase of the output of the phase detector, it is possible to determine what the next bit or data pulse will be. As a result, the phase of the PLL loop or signal applied to the DCO 14 can be adjusted intelligently.

The inherent nature of the magnetically encoded data determines that early and late pulses should be shifted by the same magnitude. Thus, if an early pulse or bit is followed by a late pulse or bit, the phase shift of the two should add to zero. If this does not occur, the amount of the phase change needs to be taken into consideration; and the PLL requires adjusting. It is inherent in the manner in which data is encoded on floppy disks and computer hard disks that an early bit is always followed by one which is late, or one which is on time. Similarly, a late bit is always followed by one which is early, or by one which is on time. This information then can be used to determine the amount of shift needed to adjust or compensate for the phase shift information, which otherwise would be applied to the oscillator 14 of the PLL.

To compensate for shifted bits, the binary state of the current bit or pulse from the bit detector 18 is applied over a lead 19 to a shift predictor circuit 21 in a filter block for the PLL. The output of the phase detector 17 is a standard output applied over a pair of "up" and "down" output leads 17A and 17B, respectively, to an up/down counter 20. The phase detector 17 and counter 20 may be of any standard configuration used with a digital phase-locked loop system.

The output of the counter 20 then is applied as one of two inputs to a filter 24, which also has the output of the shift predictor 21 applied to it. The filter 24 processes the signal; so that the phase of the operation of the DCO 14 is adjusted at each unshifted bit (normal bits) and the second in each series of two shifted bits. Even though the shift predictor 21 causes a transport lag to be introduced, this does not disturb the stability of the PLL illustrated in FIG. 4 for any useful gain range. This does cause, however, the system to run with some small static phase error when tracking a changing frequency. The static phase error between the ideal and the actual in the worst case should be approximately 10 nanoseconds per bit window, i.e. 20 ns for all shifted bits, in a system operating at 505 kilobits per second.

Reference now should be made to the detailed circuit diagram of FIG. 5. As shown in FIG. 5, the incoming bits or data pulses on the lead 19 are applied to a four-bit shift register 21A (since a running four-bit pattern is all that is required to determine the predicted bit shift as described above in conjunction with FIG. 3). The shift register 21A is one portion of the shift predictor 21 of FIG. 4. The outputs of the four stages of the shift register 21A are continuously applied to a logic circuit 21B, which analyzes the patterns to determine any matters with those described above in conjunction with the table of FIG. 3, for establishing whether a bit is early or late. This logic circuit 21B also may be provided with an added provision to detect when the bit pulse should be missing (assuming MFM formatting).

The logic circuit 21B then provides an indication as to whether or not a shifted bit is present. This is indicated on the output of the logic circuit 21B, and is identified as "2nd shifted bit" in FIG. 5. The PLL filter 24 has the amount of phase difference detected between the PLL reference and incoming bit pulse signals; and, based on the analysis of the bit patterns, the filter 24 can adjust the next period of the DCO to bring the reference back into lock based on the information available. The circuit 21B also provides pulses on a lead 46 for non-shifted "OK" bits.

The manner in which the output of the logic circuit 21B is used to adjust the DCO period is accomplished by the remainder of the circuit shown in FIG. 5. The output of the up/down phase difference counter 20 typically appears on parallel leads obtained from each of the stages of the counter. This is indicated in FIG. 5 as being as seven-stage or seven-lead output, and a wide arrow with the reference "(7)" is shown as applied to one of the inputs of a multiplex register 26. It should be noted at this time that the parallel data transfer of this seven-bit wide information, through different circuitry of FIG. 5, is indicated in the remainder of FIG. 5 by heavy interconnecting lines. Most of the interconnections of the remainder of the circuit components of FIG. 5 are interconnected by means of parallel seven-bit-wide data. The multiple parallel stages for effecting the data transfer have been illustrated in FIG. 5 as single blocks (rather than seven parallel blocks) in order to simplify the drawing, and to avoid cluttering.

Data is transferred from the data multiplex register 26 on its output, and constitutes the phase difference output (PD) between the reference and incoming data pulses. This output is applied to a first set of seven buffer flip-flops 28, and also to one of two inputs (+) to a subtractor circuit 38. The output of the buffer flip-flops 28 then constitutes the last phase detector output ("LASTPD") or the old phase error, one comparison window delayed from that which is currently available on the output of the multiplex register 26. The output of the buffer flip-flops 28, in turn, is supplied to another set of buffer flip-flops 30, the output of which represents the previous older phase error "LAST1PD" (two comparison windows older than the current data "PD" available at the output of the multiplex register 26).

The outputs of the flip-flops 28 and 30 are applied, respectively, to the "0" inputs of two multiplex circuits 31 and 32, respectively.

The information transferred into and from the register 26 and the flip-flop stages 28 and 30 is effected by means of "Fix PD" pulses on a lead 43, fix clock pulses appearing over a lead 44, and "Load PD" pulses on a lead 44. An AND gate 39 and a NOR gate 40 combine these pulses to control the operation of the register 26. These are the clock pulses which are used to clock the registers once in windows in which data pulses were detected. Consequently, the registers 28 and 30 are clocked only once in a bit window, and only on bit windows where bit pulses or data pulses appear. The register 26 is clocked twice after bit windows in which incoming data pulses were detected. The first of these clocks is used to clock the phase difference count into the register 26. The second of these clocks, occurring later in the same window as the first, clocks the value in register 26 minus that from the adder 37, by way of the subtractor 38. This value represents the measured value less the phase error, which already will be adjusted for by the time the phase error in register 26 is utilized. Consequently, a phase error is adjusted for only once, as is appropriate, even though it will appear in more than one measured error.

It should be noted that the sum out of adder 37 is taken from bits 7 through 1, not 6 through 0. This is a shift right of the result one bit, accomplishing a divide-by-2. This value:

$$\frac{\text{shift right value} + \text{shift left value}}{2}$$

gives the average actual phase shift.

As indicated in FIG. 5, the information in the multiplexed register 26 and flip-flops 28 and 30 then is present at the inputs of the multiplexor circuits 31 and 32, and the positive input of the substractor circuit 38. If there are no shifted bits, the one bit delayed signal "last PD" applied to the multiplexor 31 is passed through the multiplexor 31 to an adder 34, the output of which then is supplied to the DCO period determining circuit 35, to produce the output (DCO PERIOD OUT) from the digitally controlled oscillator. Note that the DCO used this adjusted period once, thereby correcting the phase error, then reverts to the previous period. This previous period is the base frequency of the incoming signal as determined by an average taken over many bit windows.

The adder 34 controls the oscillator 35 in a conventional manner through a multiplexor 50. If no shifted bits are predicted by the logic 21B, this is the normal operation of the system; and it is comparable to a conventional digital PLL circuit operation, with the exception that the information used to control the DCO period 35 is delayed by one bit from the information supplied to the input of the multiplexor register 26. The 2nd shifted bits and OK bits provide inputs to a NOR gate 51 to control the operation of the multiplexor 50 to determine which of the two inputs "A" or "B" of the multiplexor 50 are supplied to its output.

If, however, the logic circuit 21B indicates that the bit is the second of two shifted bits, a pulse is applied to both of the multiplexors 31 and 32. When this occurs, the information supplied to the adder 34 from the multiplexor 31 is obtained from the output of the adder 37, shifted by two, and the output identified as "temp".

This averages the phase error of the two shifted bits, (one in each window) since that information is a combination of the outputs of the flip-flop stages 28 and 30. The shifted output of the adder 37 also is applied to the subtraction input (−) of the subtractor 38 to produce a modified signal to the "DA" input of the multiplex register 26, thereby adjusting its output. Thus, the currently measured phase error is adjusted by the amount of phase correction to be made. Consequently, when the phase is corrected to compensate for the error just measured (one or two bit windows in the future) corrections made in the interim are included, so as not to over-correct and cause "hunting". That adjusted output then is utilized in the continued operation of the system to modify the information supplied to the flip-flop stage 28 and the multiplex 31 to the adder 34. This results in the desired compensation for the predicted bit shift pattern, in accordance with the algorithm indicated in the table of FIG. 3.

Operation of the system shown in FIG. 5 has resulted in significantly improved performance of the digital phase-locked loop over systems which do not include the bit shift compensation provided by the circuit of FIG. 5. The circuit of FIG. 5 is a filter which operates in a high-gain mode at all times, and which provides greatly improved performance.

The foregoing description of the preferred embodiment of the invention should be considered as illustrative, and not as limiting. Various changes and modifications will occur to those skilled in the art, without departing from the true scope of the invention as defined in the appended claims.

I claim:

1. A digital filter for a phase-locked loop including in combination:
    a source of a sequence of data pulses for synchronization with pulses at a reference frequency, some of said data pulses being shifted from their intended position in a predetermined manner dependent upon the pattern of binary bit values adjacent pulses in the sequence of data pulses;
    a source of reference pulses at said reference frequency;
    phase detector means with first and second inputs coupled with said source of data pulses and said source of reference pulses, respectively, said phase detector producing output signals indicative of the phase difference between signals applied to the first and second inputs thereof;
    counter means, coupled with the output of said phase detector and controlled thereby, for producing an output count indicative of the phase difference of said data pulses and said reference pulses;
    shift prediction means coupled with said source of data pulses for analyzing a predetermined number of successive data pulses for producing an output signal indicative of the direction of shift of each one of said data pulses which is shifted from its intended position in the sequence of data pulses sequence;
    control means coupled with the output of said counter means and with said shift prediction means for producing a control signal in which the output count from said counter is modified by the output signal of said shift prediction means for controlling said source of reference pulses to synchronize said reference pulses with said data pulses.

2. The combination according to claim 1 wherein said prediction means includes a multiple-stage shift register to which said source of data pulses is connected for producing a moving window of a predetermined number of adjacent data pulses in the sequence of data pulses from said source of data pulses; and logic circuit means coupled with said shift register for analyzing each successive pattern of data pulses in said shift register for producing an output indicative of each occurrence of a data pulse shifted from its intended position and the direction of shift of each shifted data pulse.

3. The combination according to claim 2 wherein said shift prediction means operates to delay the application of control signals to said source of reference pulses by a predetermined amount sufficient to determine the presence or absence of a shifted pulse in the sequence of data pulses from said source of data pulses.

4. The combination according to claim 3 wherein said delay is effected by at least one stage of buffer circuit means responsive to the output of said counter means.

5. The combination according to claim 4 wherein said shift register is a four-stage shift register, with the output of each stage supplied in parallel to said logic circuit means for determining the presence or absence of a shifted data pulse.

6. The combination according to claim 2 wherein said shift register is a four-stage shift register, with the output of each stage supplied in parallel to said logic circuit means for determining the presence or absence of a shifted data pulse.

7. The combination according to claim 1 wherein said shift prediction means operates to delay the application of control signals to said source of reference pulses by a predetermined amount sufficient to determine the presence or absence of a shifted pulse in the sequence of data pulses from said source of data pulses.

8. The combination according to claim 7 wherein said delay is effected by at least one stage of buffer circuit means responsive to the output of said counter means.

9. The combination according to claim 1 wherein said delay is effected by at least one stage of buffer circuit means responsive to the output of said counter means.

* * * * *